United States Patent [19]

Frick

[11] Patent Number: 5,424,650
[45] Date of Patent: Jun. 13, 1995

[54] CAPACITIVE PRESSURE SENSOR HAVING CIRCUITRY FOR ELIMINATING STRAY CAPACITANCE

[75] Inventor: Roger L. Frick, Hackensack, Minn.

[73] Assignee: Rosemont Inc., Eden Prairie, Minn.

[21] Appl. No.: 126,364

[22] Filed: Sep. 24, 1993

[51] Int. Cl.⁶ .................... G01R 27/26; G01L 9/04
[52] U.S. Cl. .................... 324/688; 324/661;
73/718; 73/862.626; 361/283.1
[58] Field of Search ............ 324/661, 688; 73/718,
73/724, 517 R, 862.626; 361/283.1, 283.4

[56] References Cited

U.S. PATENT DOCUMENTS

| | | | |
|---|---|---|---|
| D. 317,226 | 6/1991 | Broden et al. ............ | D10/46 |
| 3,975,719 | 8/1976 | Frick .................... | 340/200 |
| 4,276,533 | 6/1981 | Tominaga et al. ......... | 338/4 |
| 4,339,750 | 7/1982 | Delacruz ................. | 340/870.37 |
| 4,517,622 | 5/1985 | Male ..................... | 361/283 |
| 4,586,108 | 4/1986 | Frick .................... | 361/283 |
| 4,603,371 | 7/1986 | Frick .................... | 361/283 |
| 4,644,798 | 2/1987 | Tamura et al. ........... | 73/708 |
| 4,800,758 | 1/1989 | Knecht et al. ........... | 73/727 |
| 4,806,783 | 2/1989 | Anderson ................ | 361/283.1 X |
| 4,833,922 | 5/1989 | Frick et al. ............ | 73/756 |
| 5,022,270 | 6/1991 | Rud, Jr. ................ | 73/706 |
| 5,081,867 | 1/1992 | Yamada .................. | 73/517 R |
| 5,083,091 | 1/1992 | Frick et al. ............ | 324/678 |
| 5,094,109 | 3/1992 | Dean et al. ............. | 73/718 |
| 5,178,015 | 1/1993 | Loeppert et al. ......... | 73/718 |
| 5,329,818 | 7/1994 | Frick et al. ............ | 73/718 X |
| 5,347,867 | 9/1994 | Pangerl ................. | 73/517 R |

*Primary Examiner*—Kenneth A. Wieder
*Assistant Examiner*—Glenn W. Brown
*Attorney, Agent, or Firm*—Westman, Champlin & Kelly

[57] ABSTRACT

A pressure sensor measures pressure by measuring capacitance between two capacitive plates. Pressure change appears as a change in capacitance. Stray capacitance interferes with this measurement. The stray capacitance arises between the capacitor plates and surrounding material. Circuitry reduces stray capacitance by maintaining substantially no potential difference between a capacitor plate and surrounding material responsible for stray capacitance.

7 Claims, 5 Drawing Sheets

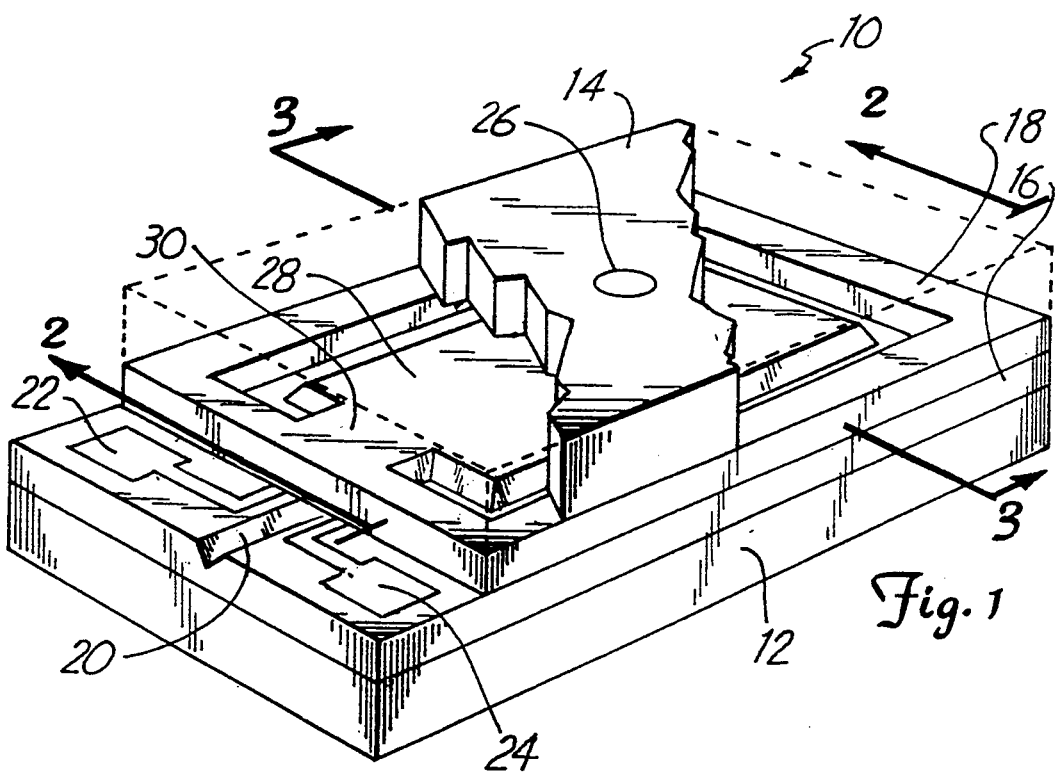
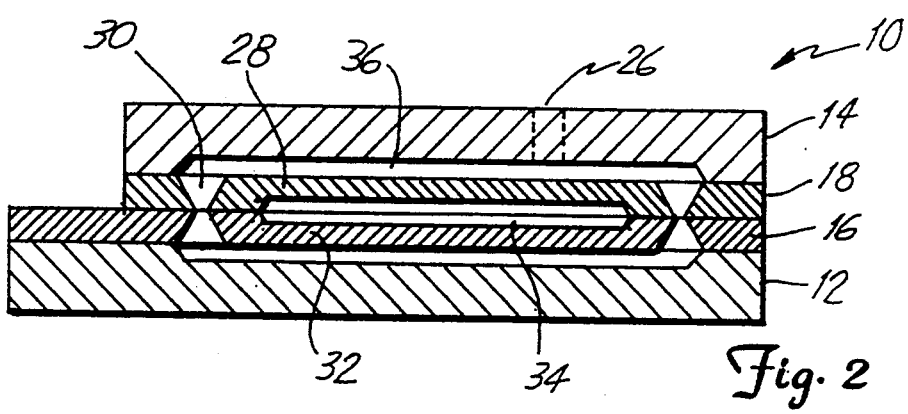
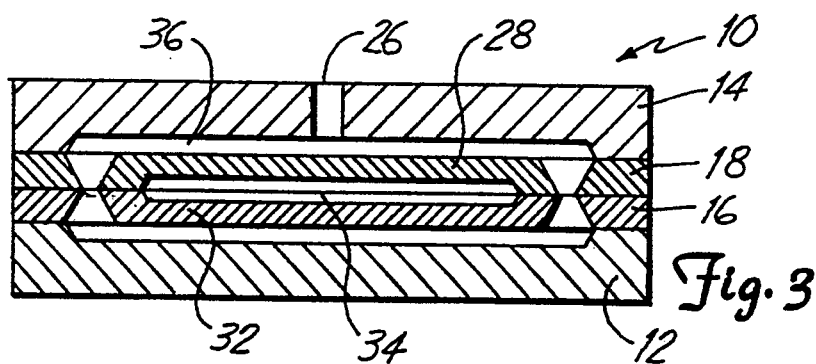

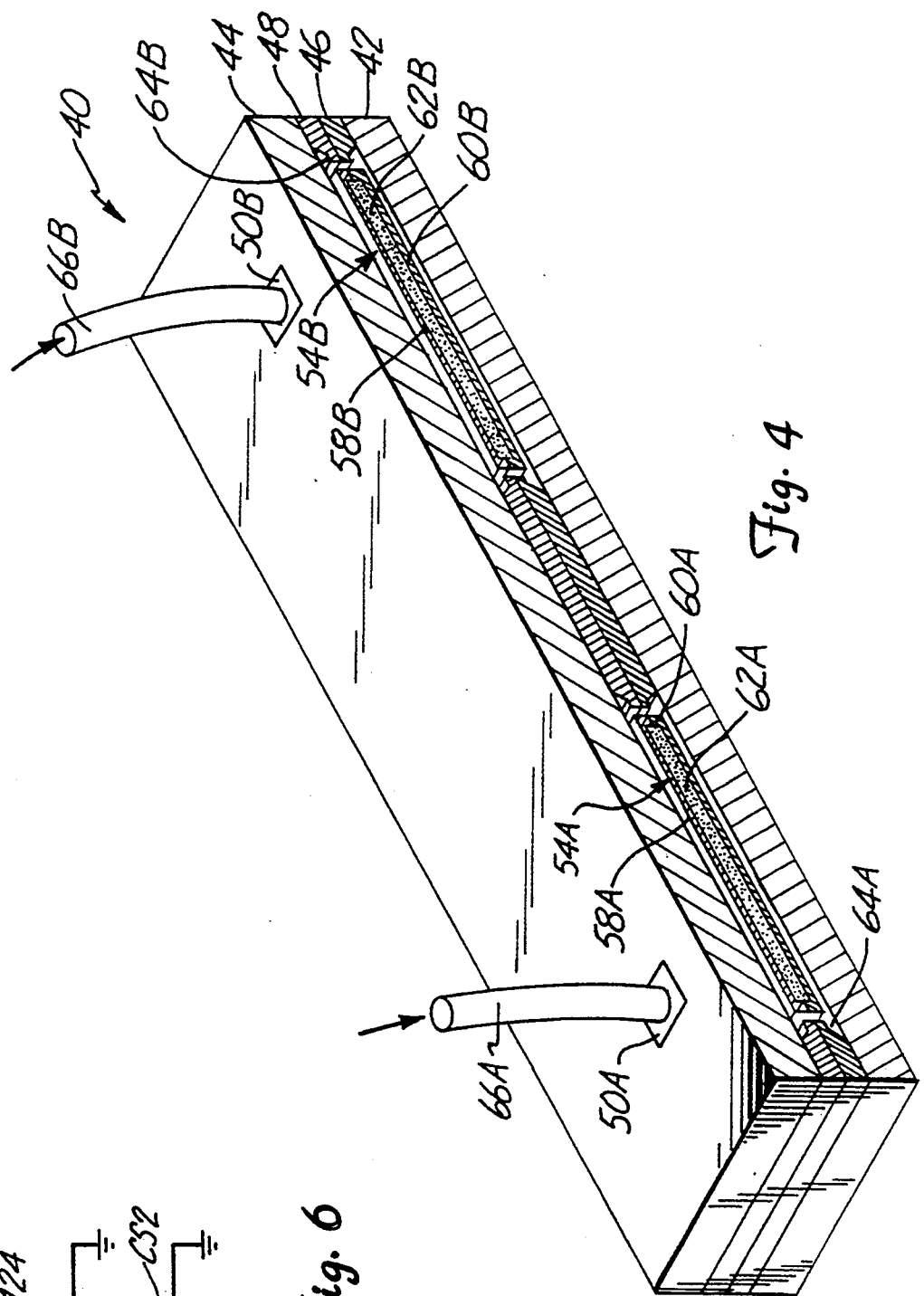
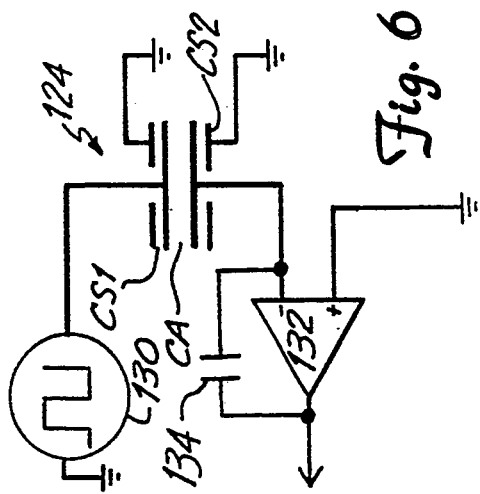

CAPACITIVE PRESSURE SENSOR HAVING CIRCUITRY FOR ELIMINATING STRAY CAPACITANCE

BACKGROUND OF THE INVENTION

The present invention relates to a pressure sensor. In particular, the invention relates to a capacitance pressure sensor having circuitry to reduce the effects of stray capacitance.

The prior art shows various solid state pressure sensors which have a deflectable diaphragm for sensing pressure. Some are capable of being formed by batch processing. It is desirable to have solid state pressure sensors made of relatively rigid materials, such as semiconductor materials.

A capacitive pressure sensor measures pressure by measuring capacitance between two capacitive plates. Pressure change appears as a change in capacitance. In a pressure sensor made from a semiconductor, stray capacitance can be introduced in capacitance measurements and cause errors in measurements. This stray capacitance arises between the plate of the capacitor and nearby semiconductor material which acts as a capacitor plate.

U.S. Pat. No. 4,612,599, issued Sep. 16, 1986, entitled "Capacitive Pressure Sensor," shows a pressure sensor formed with silicon. U.S. Pat. No. 4,800,758, issued Jan. 31, 1989, entitled "Pressure Transducer with Stress Isolation for Hard Mounting" describes a batch fabricated pressure sensor with stress isolation.

SUMMARY OF THE INVENTION

The present invention provides circuitry for use in a capacitance based pressure sensor. The circuitry reduces the effects of stray capacitance in capacitance measurements used to determine pressure of a process fluid. The circuitry includes a variable sensing capacitor having first and second capacitor plates with a capacitance between the plates which varies as a function of a sensed parameter. Each of the capacitor plates has stray capacitance relative to guard plates arranged around the first and second capacitor plates. A reference potential source is provided and a drive circuit provides a drive potential to the first capacitor plate which alternates relative to the reference potential. A sensing circuit connected to the reference potential generates a virtual reference potential substantially equal to the reference potential. Charge sensing circuitry connected to the second capacitor plate senses charge on the second capacitor plate such that there is no potential difference between the second capacitor plate and the guard at the time when charge transfer is complete.

BRIEF DESCRIPTION OF THE DRAWINGS

FIG. 1 is a perspective fragmentary view of a suspended diaphragm pressure sensor in accordance with the present invention.

FIG. 2 is a cross-sectional view of FIG. 1 taken along the line labeled 2—2.

FIG. 3 is a cross-sectional view of FIG. 1 taken along the line labeled 3—3.

FIG. 4 is a cross-sectional perspective view of a differential pressure sensor in accordance with the present invention.

FIG. 6 is a schematic diagram of guard capacitance circuitry.

DETAILED DESCRIPTION OF THE PREFERRED EMBODIMENTS

Figure 5:
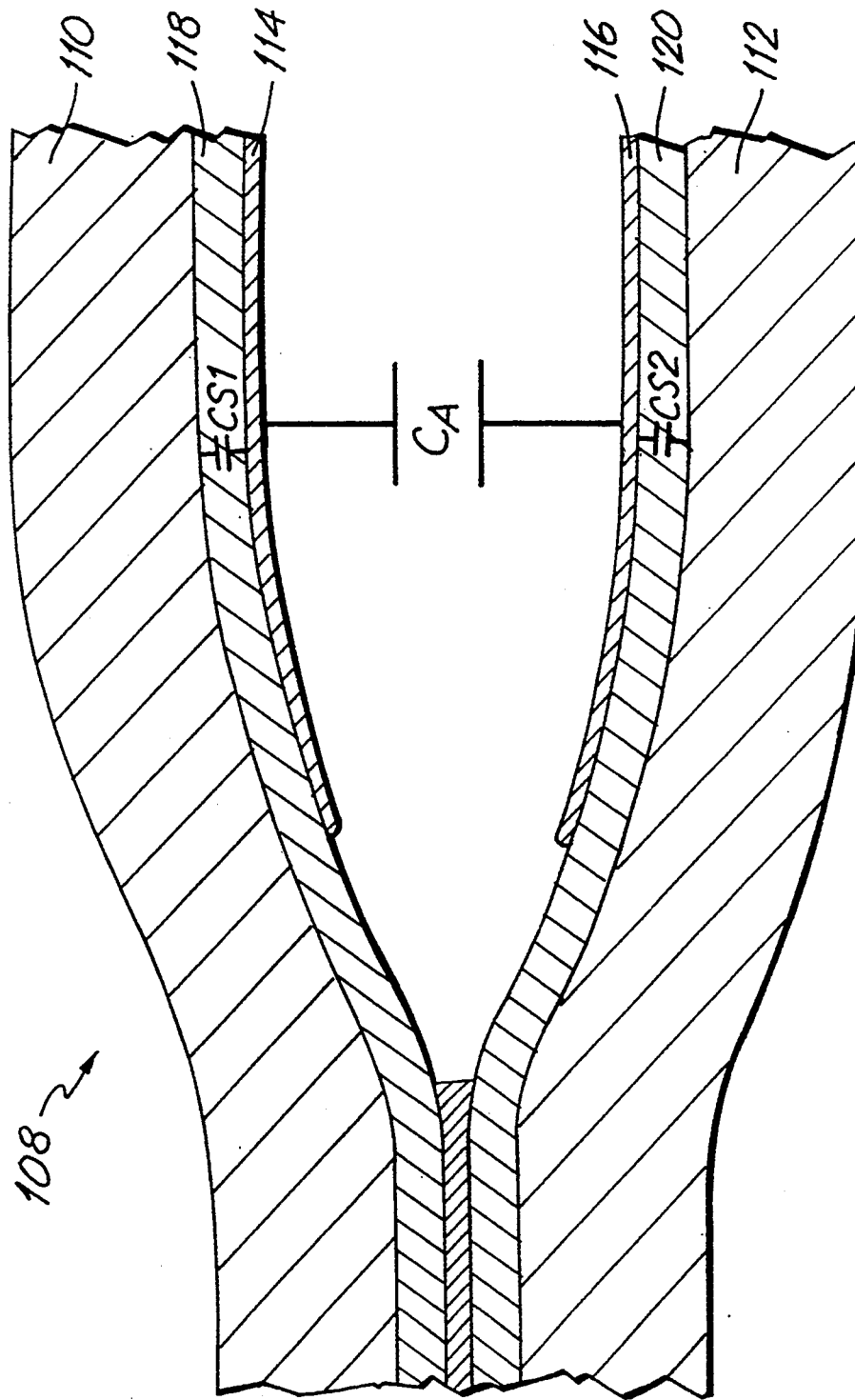
FIG. 5 is a cross-sectional view of a diaphragm pair in accordance with the present invention showing system electrical capacitance.

The pressure sensor layers of the present invention are made using batch fabrication techniques. A silicon wafer or layer is etched in a conventional manner to form the desired features and is then formed into a sandwich construction with additional layers of suitable material to form the sensor. Such sensors are described in the U.S. patent application Ser. No. 08/123,729 entitled SUSPENDED DIAPHRAGM PRESSURE SENSOR filed Sep. 20, 1993, and assigned to the same assignee as the present application, which is hereby incorporated by reference.

Forming a pressure sensor using semiconductor materials often results in stray capacitance which can cause errors in pressure measurement. The capacitance arises because semiconductors are partial conductors and are able to act as the plates of a capacitor. Thus, a stray capacitance arises between the capacitor plate used to measure pressure and the surrounding semiconductor (a guard plate).

FIG. 1 is a perspective fragmentary view of suspended diaphragm pressure sensor 10. Suspended diaphragm pressure sensor 10 includes lower substrate 12 and upper substrate 14. Lower diaphragm substrate 16 is bonded to upper substrate 14. Lower diaphragm substrate 16 and upper diaphragm substrate 18 are bonded together. Lower diaphragm substrate 16 carries channel 20 and electrical contacts 22 and 24. Pressure inlet 26 extends through upper substrate 14. Upper diaphragm substrate 18 includes upper diaphragm 28 carried by support tab 30.

FIG. 2 is a cross-sectional view of suspended diaphragm pressure sensor 10 taken along the line labeled 2—2 in FIG. 1. FIG. 3 is a cross-sectional view of suspended diaphragm pressure sensor 10 taken along the line labeled 3—3 in FIG. 1. FIGS. 2 and 3 show lower diaphragm 32 coupled to upper diaphragm 28. Upper diaphragm 28 and lower diaphragm 32 form a diaphragm assembly having diaphragm cavity 34 which typically contain a reference pressure applied through channel 20. Upper and lower diaphragms 28 and 32 are joined along their rims. Upper diaphragm 28 and lower diaphragm 32 are suspended in pressure input cavity 36 which is coupled to pressure inlet 26.

In operation, suspended diaphragm pressure sensor is used to sense the difference in pressure between cavity 34 and cavity 36. Diaphragm cavity 34 expands and contracts inside pressure input cavity 36 in response to pressure applied through pressure inlet 26. This causes upper diaphragm 28 and lower diaphragm 32 to bend inward into diaphragm cavity 34 or to deflect outward away from diaphragm cavity 34. Fluid flows into cavity 34 or out of cavity 34 via channel 20 which extends through tab 30. Deflection of diaphragms 28 and 32 (and therefore applied pressure) is detected with electrical contacts 22 and 24. These contacts are coupled to sensors carried on diaphragms 28 and 32. In one embodiment, these sensors are capacitive plates or metallizations. Diaphragm 28 carries a capacitive plate and diaphragm 32 carries a capacitive plate. Displacement of the plates due to pressure applied through inlet 26 causes the electrical capacitance therebetween to change. In another embodiment, electrical contacts 22 and 24 are coupled to a strain gage on a diaphragm which changes resistance as diaphragms 28 and 32 are deformed.

In a preferred embodiment, suspended diaphragm pressure sensor 10 is formed of brittle materials such as single crystal silicon or sapphire materials and batch fabricated. These materials provide improved accuracy because of reduced hysteresis and improved dimension stability. Furthermore, materials such as silicon, ceramic and glass, are easily batch fabricated using known fabrication techniques.

FIG. 4 is a perspective cross-sectional view of suspended diaphragm differential pressure sensor 40 in accordance with the present invention. Sensor 40 is formed by placing a pair of pressure sensors similar to pressure sensor 10, shown in FIG. 1, together having a channel (not shown in FIG. 4) such as channel 20 in FIG. 1 extending between the diaphragm assemblies.

Differential pressure sensor 40 includes lower substrate 42, upper substrate 44, lower diaphragm substrate 46 and upper diaphragm substrate 48. Differential pressure is applied via pressure inlets 50A and 50B. Pressure inlets 50A and 50B are coupled to diaphragm assemblies 54A and 54B, respectively. Diaphragm assembly 54A includes upper diaphragm 58A and lower diaphragm 60A which form diaphragm cavity 62A. Diaphragm cavity 62A is carried in pressure inlet cavity 64A which is coupled to pressure inlet 50A. The structure of diaphragm assembly 54B is similar to that of diaphragm assembly 54A.

In differential pressure sensor 40, diaphragm cavity 62A is coupled to diaphragm cavity 62B through a channel not shown in FIG. 4 but which is similar to channel 20 shown in FIG. 1. The channel connecting cavities 62A and 62B extends through tabs that support diaphragm assemblies 54A and 54B within cavities 64A and 64B, respectively. Cavities 62A and 62B are filled with a sealed-in quantity of a relatively incompressible fluid so that as one cavity expands due to applied pressure the other cavity contracts.

Deflection of the suspended diaphragms in the present invention is related to applied pressure, either differential or absolute. By detecting this deformation, it is possible to determine pressure. This detection can be measured through any suitable means. In a preferred embodiment, diaphragm deformation is detected by measuring the change in capacitance between two plates of a capacitor, one carried on each of the diaphragms. FIG. 5 is a cross-sectional view of a suspended diaphragm 108 including upper diaphragm 110 and lower diaphragm 112 which carry upper capacitive plate 114 and lower capacitive plate 116, respectively. Plates 114 and 116 are mounted to diaphragms 110 and 112 through insulating layers 118 and 120, respectively. The region between diaphragms 110 and 112 form cavity 122 which is preferably oil filled.

FIG. 5 shows capacitance CA which is the capacitance between plates 114 and 116. The value of capacitance CA is related to the pressure applied to suspended diaphragm 108. Therefore, by measuring this capacitance, pressure can be determined. However, stray capacitance CS1 and CS2 interfere with this measurement. This capacitance is due to the capacitance between plate 114 and diaphragm 110, and plate 116 and diaphragm 112, respectively. This capacitance arises because insulation layers 118 and 120 separate plates 114 and 116 from diaphragms 110 and 112, respectively. Therefore, it is desirable to eliminate the stray capacitance from the measurement of CA.

FIG. 6 shows simplified circuitry 124 to eliminate interference in the measurement of CA due to CS1 and CS2. Circuitry 124 includes square wave driver 130 coupled to a driven side of capacitor CA. One side of capacitor CS1 (i.e. substrate 110) is coupled to electrical ground as is one side of CS2 (i.e. substrate 112). A sense side of capacitor CA is coupled to the positive input of opamp 132. Opamp 132 is connected with negative feedback through integrating capacitor 136. The noninverting input to opamp 132 provides a virtual ground. The output of opamp 132 is provided to capacitive measurement circuitry which is used to calculate pressure.

Circuitry 124 keeps substrate 110 and substrate 112 at the "same potential" as the sense electrode 116. This is because sense electrode 116 is held at virtual ground by opamp 132 having negative feedback. This reduces the errors in pressure measurements due to stray capacitance because CS2 is not measured by the circuitry connected to electrode 116.

Figure 7:
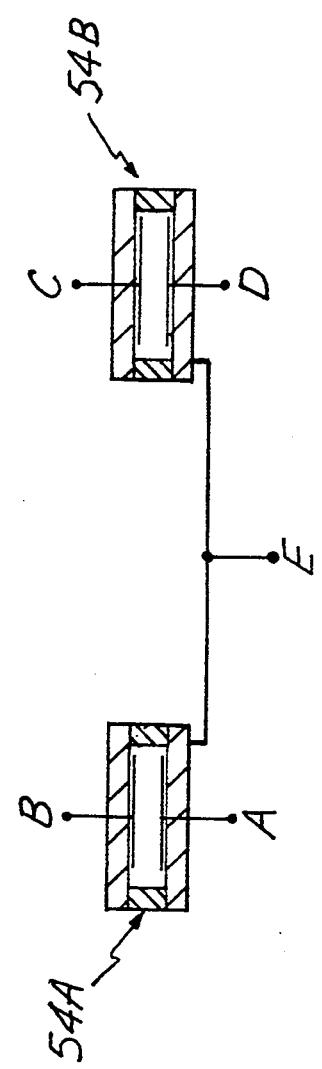
FIG. 7 is a cross-sectional view of a differential pressure sensor showing capacitor plates used to measure pressure.

FIG. 7 is a cross-sectional view of diaphragm assemblies 54A and 54B showing capacitor plates used to measure pressure. The capacitor plates are connected to contacts A, B, C and D. Diaphragm assemblies 54A and 54B are connected to electrical contact E.

Figure 8:
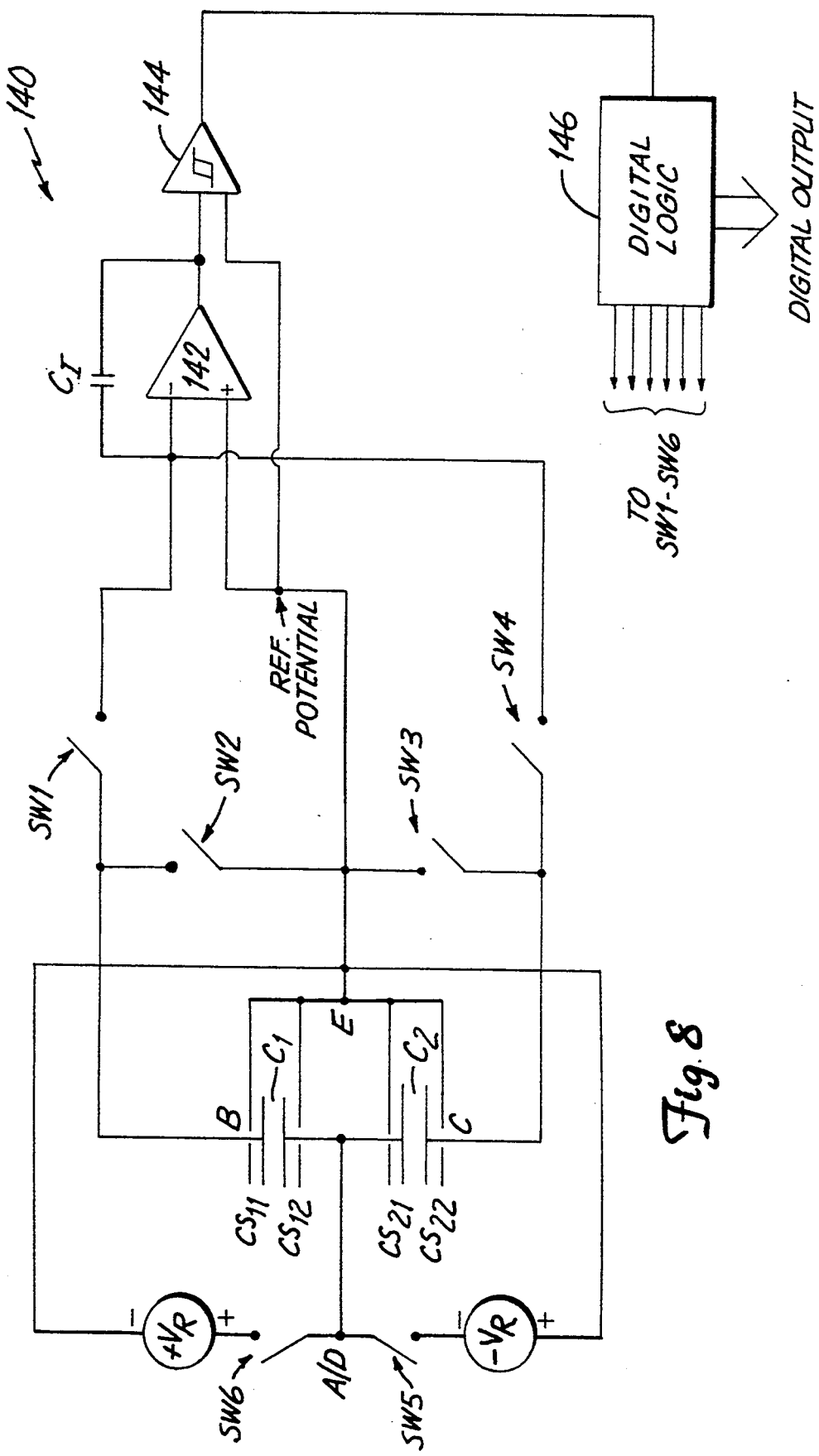
FIG. 8 is a schematic diagram of circuitry to reduce the effects of stray capacitance in accordance with the invention.

FIG. 8 is a schematic diagram of circuitry 140 to reduce the effects of stray capacitance with the invention. Circuit 140 shows capacitors C1 and C2 whose capacitance varies in response to a differential pressure between diaphragm assemblies 54A and 54B. Associated with capacitor C1 are stray capacitors CS11 and CS12. Associated with capacitor C2 are stray capacitors CS21 and CS22. These capacitors arise due to surrounding semiconductor material. FIG. 8 shows electrical contacts A, B, C, D and E, also shown in FIG. 7. Contacts A and D are coupled together. This coupling can be done externally or directly on pressure sensor 40 to reduce the number of electrical contacts to pressure sensor 40.

Circuit 140 includes operational amplifier 122 connected to Schmitt trigger 144. Operational amplifier 142 has negative feedback through integrating capacitor $C_I$. The output of Schmitt trigger 144 is coupled to digital logic 146. Power supply $+V_R$ and $-V_R$ are connected to electrode E and to electrodes A and D through switches SW6 and SW5, respectively. Electrode B is connected to operational amplifier 142 through switch SW1 and electrode C is connected to operational amplifier SW2 through switch SW4. Electrode E is connected to the noninverting input of operational amplifier 142, and electrodes B and C are connected to electrode E through switches SW2 and SW3, respectively. Switches SW1 through SW6 are connected to digital logic 146 which controls switches SW1 through SW6.

In operation, operational amplifier 122 provides an output related to the difference in capacitance between capacitors C1 and C2 which is related to differential pressure sensed by sensor 40. This is a technique for measuring capacitance which is described in U.S. Pat.

No. 5,083,091 entitled CHARGED BALANCED FEEDBACK MEASUREMENT CIRCUIT to Frick et al.

Opamp 142 maintains the sense electrodes on capacitors C1 and C2 at a virtual potential, in one embodiment virtual ground. After charge has been distributed, no charge will flow from CS11, CS12, CS21 or CS22 and these capacitances will not enter the measurement. The circuit must drive CS11 and CS22 from the $+V_R$ and the $-V_R$ power supplies.

The charging current is:

$$I_{charging} = F_{excitation} \times (V_R - (-V_R)) \times (CS11 + CS22)$$

With typical values, this current may be on the order of 0.07 ma. (CS11 and CS22 are on the order of $200 \times 10^{-12}$ Farads.) This current is compatible with 4–20 ma current loops since the charging current is much less than the minimum available current, 4 ma.

The circuit maintains electrodes B and C at the same potential as electrode E at the time when the charge transfer is complete and the capacitance measurement is taken. This is because the output of the integrator formed by opamp 122 is sampled at the point when the charge transfer is completed.

Although the present invention has been described with reference to preferred embodiments, workers skilled in the art will recognize that changes may be made in form and detail without departing from the spirit and scope of the invention. For example, the invention can be used with other types of sensors and sensor designs where stray capacitance is a problem.

What is claimed is:

1. A sensing circuit, comprising:
   a variable sensing capacitor having first and second capacitor plates with a capacitance between the plates which varies as a function of a sensed parameter, each of the capacitor plates having stray capacitance relative to guard plates arranged around the first and second capacitor plates;
   a reference potential;
   a drive circuit providing an alternating drive potential to the first capacitor plate;
   a differential amplifier having a non inverting input connected to the reference potential and generating a virtual reference potential at a negative input which is substantially equal to the reference potential and having an output related to the sensed parameter; and
   switching circuitry connected to the second capacitor plate and connecting the second capacitor plate alternately to the reference potential and the virtual reference potential at the negative input of the differential amplifier such that there is substantially no potential difference between the second capacitor plate and the guard plates.

2. The sensing circuit of claim 1 wherein the guard plates are formed of semiconductor material.

3. The sensing circuit of claim 1 wherein the differential amplifier is an operational amplifier having negative feedback through an integrating capacitor.

4. The sensing circuit of claim 1 wherein the sensed parameter is pressure.

5. A pressure measurement circuit for providing a pressure measurement output as a function of a pressure, comprising:
   a sense capacitor having a driven plate and a sense plate with a capacitance between the plates which varies as a function of the pressure;
   a stray capacitance between the sense plate and a stray capacitance plate;
   a reference potential coupled to the stray capacitance plate;
   virtual reference circuitry coupled to the reference potential, having a virtual reference potential output substantially equal to the reference potential, and an output related to capacitance of the sense capacitor;
   switching circuitry selectively coupling the reference potential and the virtual reference potential to the sense plate such that the sense plate is maintained at substantially the same potential as the stray capacitance plate;
   charge sensing circuitry connected to the sense plate and and providing the measurement output related to charge carried on the sense plate; and
   output circuitry providing the pressure measurement output based upon sensed charge.

6. The pressure measurement circuit of claim 5 wherein the stray capacitance plate is formed of semiconductor material.

7. The pressure measurement circuit of claim 5 wherein the virtual reference circuitry is an operational amplifier having negative feedback through an integrating capacitor.

* * * * *

UNITED STATES PATENT AND TRADEMARK OFFICE
CERTIFICATE OF CORRECTION

PATENT NO. : 5,424,650
DATED : June 13, 1995
INVENTOR(S) : Roger L. Frick

It is certified that error appears in the above-indentified patent and that said Letters Patent is hereby corrected as shown below:

On the title page;

Under [73] ASSIGNEE, please change "Rosemont" to --Rosemount--.

Signed and Sealed this

Sixteenth Day of January, 1996

Attest:

BRUCE LEHMAN

Attesting Officer

Commissioner of Patents and Trademarks